(12) United States Patent
Omae

(10) Patent No.: US 10,362,718 B2
(45) Date of Patent: Jul. 23, 2019

(54) PROTECTIVE TUBE AND HARNESS

(71) Applicant: Sumitomo Wiring Systems, Ltd., Yokkaichi, Mie (JP)

(72) Inventor: Hikaru Omae, Mie (JP)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 0 days.

(21) Appl. No.: 15/835,974

(22) Filed: Dec. 8, 2017

(65) Prior Publication Data
US 2018/0184552 A1  Jun. 28, 2018

(30) Foreign Application Priority Data

Dec. 27, 2016  (JP) .................................. 2016-254071

(51) Int. Cl.
| | | |
|---|---|---|
| H02G 15/04 | (2006.01) | |
| H05K 9/00 | (2006.01) | |
| H02G 3/04 | (2006.01) | |
| H01B 7/00 | (2006.01) | |
| H01B 7/282 | (2006.01) | |

(52) U.S. Cl.
CPC ......... *H05K 9/0088* (2013.01); *H01B 7/0045* (2013.01); *H01B 7/2825* (2013.01); *H02G 3/0468* (2013.01); *H02G 3/0481* (2013.01); *H05K 9/0098* (2013.01)

(58) Field of Classification Search
CPC .............................. H01R 9/0503; H02G 15/04
USPC ................. 174/75 C, 88 R, 88 C, 102 D, 78; 285/354, 373
See application file for complete search history.

(56) References Cited

U.S. PATENT DOCUMENTS

| | | | | |
|---|---|---|---|---|
| 3,728,472 A | * | 4/1973 | Leuteritz ................ | H01R 4/646 174/78 |
| 4,590,950 A | * | 5/1986 | Iwaszkiewicz .......... | H01R 4/00 174/75 R |
| 5,077,449 A | * | 12/1991 | Cornibert .............. | B29C 47/027 156/244.12 |
| 6,217,380 B1 | * | 4/2001 | Nelson ................. | H01R 24/542 439/578 |
| 6,239,373 B1 | * | 5/2001 | Sato ....................... | H01R 4/723 174/750 |
| 6,315,332 B1 | * | 11/2001 | Aschoff .............. | F01N 13/1816 285/226 |
| 6,534,714 B2 | * | 3/2003 | Daume .................. | H01R 4/646 174/78 |
| 7,563,100 B1 | * | 7/2009 | Smith ..................... | F16L 27/12 439/33 |
| 9,124,026 B2 | * | 9/2015 | Nakamura .......... | A61B 1/00114 |
| 9,968,017 B2 | * | 5/2018 | Yamasaki ............. | H02G 3/0412 |

(Continued)

FOREIGN PATENT DOCUMENTS

JP    2012165562 A    8/2012

*Primary Examiner* — Chau N Nguyen
(74) *Attorney, Agent, or Firm* — Reising Ethington, P.C.

(57) ABSTRACT

A protective tube that includes an electromagnetic shielding tube, and that allows the electromagnetic shielding tube to be easily engaged with another member, and a harness including the protective tube are provided. The protective tube includes an electromagnetic shielding tube. The electromagnetic shielding tube includes at least a conductive layer and an outer layer that covers the conductive layer. The electromagnetic shielding tube includes a recess that is recessed from an outer surface of the outer layer.

4 Claims, 4 Drawing Sheets

(56) References Cited

U.S. PATENT DOCUMENTS

2005/0099005 A1* 5/2005 Fullbeck ............. F16L 33/2073
                                                      285/256
2015/0129296 A1* 5/2015 Cataldo ................ H02G 3/0468
                                                      174/388

* cited by examiner

PROTECTIVE TUBE AND HARNESS

CROSS REFERENCE TO RELATED APPLICATIONS

This application claims the priority of Japanese patent application JP2016-254071 filed on Dec. 27, 2016, the entire contents of which are incorporated herein.

TECHNICAL FIELD

The present invention relates to a protective tube that includes a shielding layer and protects a wire, and a harness including the protective tube.

BACKGROUND ART

A wire is covered with a protective tube that protects the wire from water, dust, etc. The protective tube is configured as a coupled body of a plurality of types of tubes with different structures. For example, the protective tube includes an electromagnetic shielding tube that protects an intermediate portion of a wire, and a rubber grommet that provides protection between the electromagnetic shielding tube and a connector of the wire.

As an example of the electromagnetic shielding tube, the technology described in JP 2012-165562A is known. The electromagnetic shielding tube includes, from the inner side, a resin inner layer, a conductive layer, and a resin outer layer that covers the conductive layer, in this order.

JP 2012-165562A is an example of related art.

SUMMARY

Meanwhile, the electromagnetic shielding tube does not have a catching portion, and it is therefore difficult to achieve engagement (e.g., connection or support) between the electromagnetic shielding tube and another member.

A protective tube that solves the above-described problems is a protective tube that protects a wire, including an electromagnetic shielding tube, wherein the electromagnetic shielding tube includes at least a conductive layer and an outer layer that covers the conductive layer, and the electromagnetic shielding tube includes a recess that is recessed from an outer surface of the outer layer.

With this configuration, the recess of the electromagnetic shielding tube can be used as a portion for engaging with another member, thus allowing the electromagnetic shielding tube to be easily engaged with another member.

In the above-described protective tube, the protective tube includes the electromagnetic shielding tube, and a connection tube that is connected to the electromagnetic shielding tube, the electromagnetic shielding tube includes at least one said recess, the recess being provided at an end portion of the electromagnetic shielding tube to which the connection tube is connected, and the connection tube includes a protrusion for engagement with the recess, and the protrusion of the connection tube is engaged with the recess.

With this configuration, the recess of the electromagnetic shielding tube is engaged with the protrusion of the connection tube. Accordingly, the electromagnetic shielding tube and the connection tube can be easily connected to each other.

In the above-described protective tube, the protective tube includes the electromagnetic shielding tube, and a corrugated tube that is connected to the electromagnetic shielding tube, and the electromagnetic shielding tube includes at least one said recess, the recess is configured as an annular groove that is continuous around an extended axis of the electromagnetic shielding tube at an end portion to which the corrugated tube is connected, and the recess is disposed inward of an end of the electromagnetic shielding tube in a direction extending along the extended axis, and an annular protrusion of the corrugated tube is fitted to the recess.

With this configuration, the recess of the electromagnetic shielding tube is engaged with the annular protrusion of the corrugated tube, thus connecting the electromagnetic shielding tube to the corrugated tube. Thus, the electromagnetic shielding tube and the corrugated tube can be easily connected to each other.

In the above-described protective tube, the protective tube includes the electromagnetic shielding tube, and a conductive braided member that is connected to the electromagnetic shielding tube, and the electromagnetic shielding tube includes at least one said recess, the recess is provided at an end portion of the electromagnetic shielding tube to which the braided member is connected, so as to expose the conductive layer of the electromagnetic shielding tube, and the recess is configured as an annular groove or arc-shaped groove that is continuous around an extended axis of the electromagnetic shielding tube, inward of an end of the electromagnetic shielding tube in a direction extending along the extended axis of the electromagnetic shielding tube, and at least a part of the braided member is fastened and depressed into the recess by a band.

With this configuration, the conductive layer exposed in the recess of the electromagnetic shielding tube is connected to the braided member. Thus, the electromagnetic shielding tube and the braided member can be easily connected to each other such that the conductive layer of the electromagnetic shielding tube and the braided member are brought into electrical conduction.

In the above-described protective tube, the protective tube includes the electromagnetic shielding tube, a conductive braided member that is connected to the conductive layer of the electromagnetic shielding tube, a corrugated tube that is connected to the electromagnetic shielding tube so as to cover the braided member, and a waterproofing cover that covers a connection portion between the electromagnetic shielding tube and the corrugated tube, the electromagnetic shielding tube includes at least one said recess, the recess is configured as an annular groove that is continuous around an extended axis of the electromagnetic shielding tube at an end portion to which the corrugated tube is connected, the recess is disposed inward of an end of the electromagnetic shielding tube in a direction extending along the extended axis, and is configured to expose the conductive layer of the electromagnetic shielding tube, at least a part of the braided member is disposed so as to be in contact with the conductive layer in the recess, the waterproofing cover includes an insertion portion that is inserted into an annular recess located on the opposite side of the annular protrusion of the corrugated tube, and the waterproofing cover is fastened to the electromagnetic shielding tube with a band such that the insertion portion of the waterproofing cover is inserted into the annular recess of the corrugated tube, and that the annular protrusion located on the opposite side of the annular recess is fitted to the recess of the electromagnetic shielding tube with the braided member interposed therebetween.

With this configuration, the braided member, the corrugated tube, and the waterproofing cover are collectively fastened to the electromagnetic shielding tube by the band. Accordingly, the electromagnetic shielding tube, the braided member, the corrugated tube, and the waterproofing cover can be easily connected to each other.

In the above-described protective tube, the recess is configured as an annular groove that is continuous around an extended axis of the electromagnetic shielding tube between opposite end portions of the electromagnetic shielding tube, and has a depth that does not reach the conductive layer.

With this configuration, the clamp that holds the electromagnetic shielding tube can be engaged with the recess.

A harness that solves the above-described problem includes: any one of the above-described protective tubes and a wire that is inserted through the protective tube.

The protective tube is provided with the recess, and thus can be easily engaged with another member, making it possible to increase the manufacturing efficiency of the harness.

In the above-described protective tube and harness, the engagement between the electromagnetic shielding tube and another member can be easily achieved.

EMBODIMENTS

First Embodiment

Figure 1:
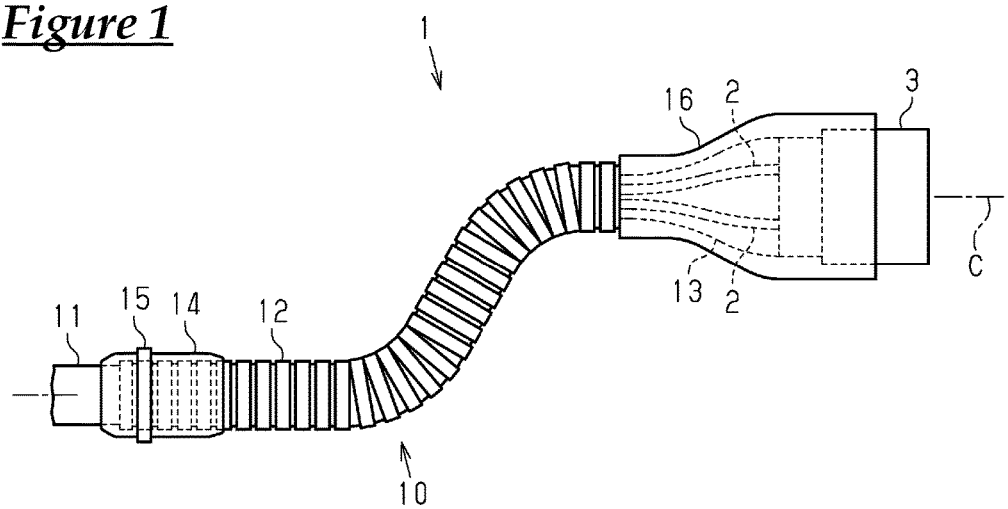
FIG. 1 is a schematic diagram of a harness.

A harness 1 according to a first embodiment will be described with reference to FIGS. 1 to 4.

The harness 1 electrically connects two, three, or more electric devices to each other. Examples of the electric devices include a vehicle drive motor, motors of various electric/electronic components mounted to a vehicle, and a power supply device.

The harness 1 includes one or more wires 2 that are coated with a resin, a connector 3 that is attached to an end portion of the wire 2, and a protective tube 10 that protects the wire 2. The casing of the connector 3 is conductive. The protective tube 10 protects the wire 2 from flying objects and the like. For example, when the wire 2 is mounted to a vehicle without using a guard, small stones (flying objects) may hit the wire 2 during travel and damage the coating. For the purpose of suppressing such damage to the wire 2, the wire 2 is protected by the protective tube 10.

The protective tube 10 includes an electromagnetic shielding tube 11 that covers the wire 2, a corrugated tube 12 that is connected to the electromagnetic shielding tube 11, and a grommet 16 that is connected to the corrugated tube 12. The grommet 16 connects the corrugated tube 12 and the connector 3. The wire 2 is shielded by the electromagnetic shielding tube 11. A portion of the wire 2 that extends from the electromagnetic shielding tube 11 to the connector 3 is shielded by a braided member 13. The braided member 13 is disposed between the wire 2 and the corrugated tube 12, and between the wire 2 and the grommet 16. The connection portion between the electromagnetic shielding tube 11 and the corrugated tube 12 is configured as follows.

Figure 2:
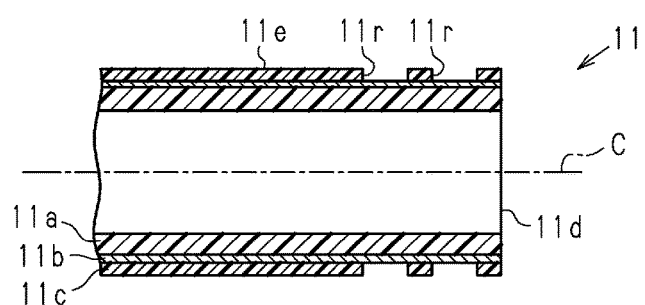
FIG. 2 is a cross-sectional view of an electromagnetic shielding tube of a harness according to a first embodiment.
Figure 3:
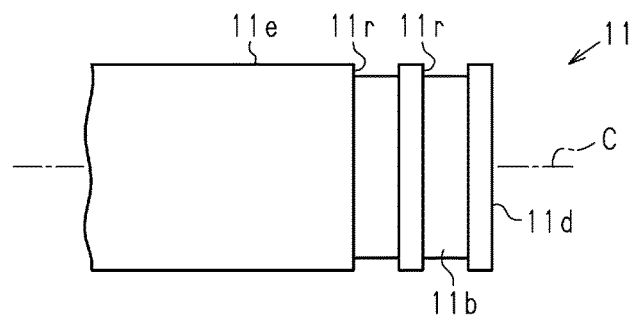
FIG. 3 is a side view of the electromagnetic shielding tube of the harness according to the first embodiment.

As shown in FIGS. 2 and 3, the electromagnetic shielding tube 11 includes a resin inner layer 11a, a conductive layer 11b disposed on the outside of the inner layer 11a, and an outer layer 11c disposed on the outside of the conductive layer 11b. The conductive layer 11b is made of a conductive metal such as copper, iron, or aluminum. Preferably, the inner layer 11a and the outer layer 11c are insulating layers. The thicknesses of the inner layer 11a and the outer layer 11c are not limited.

The electromagnetic shielding tube 11 is provided with at least one recess 11r (two recesses 11r in the present embodiment). The recess 11r is configured to be recessed from an outer surface 11e of the outer layer 11c. The recess 11r is disposed inward of an end 11d of the electromagnetic shielding tube 11 in a direction extending along an extended axis C. That is, the outer layer 11c remains at an end portion of the electromagnetic shielding tube 11. The recess 11r is configured as an annular groove that is continuous around the extended axis C at an end portion to which the corrugated tube 12 is connected. The recess 11r is also configured to expose the conductive layer 11b of the electromagnetic shielding tube 11. The groove width of the recess 11r is wider than the width of an annular protrusion 12a of the corrugated tube 12. The annular protrusion 12a of the corrugated tube 12 refers to a portion that inwardly protrudes from the inner surface of the corrugated tube 12. An annular recess 12b, which will be described later, refers to a portion that is recessed on the outer surface of the corrugated tube 12.

Figure 4:
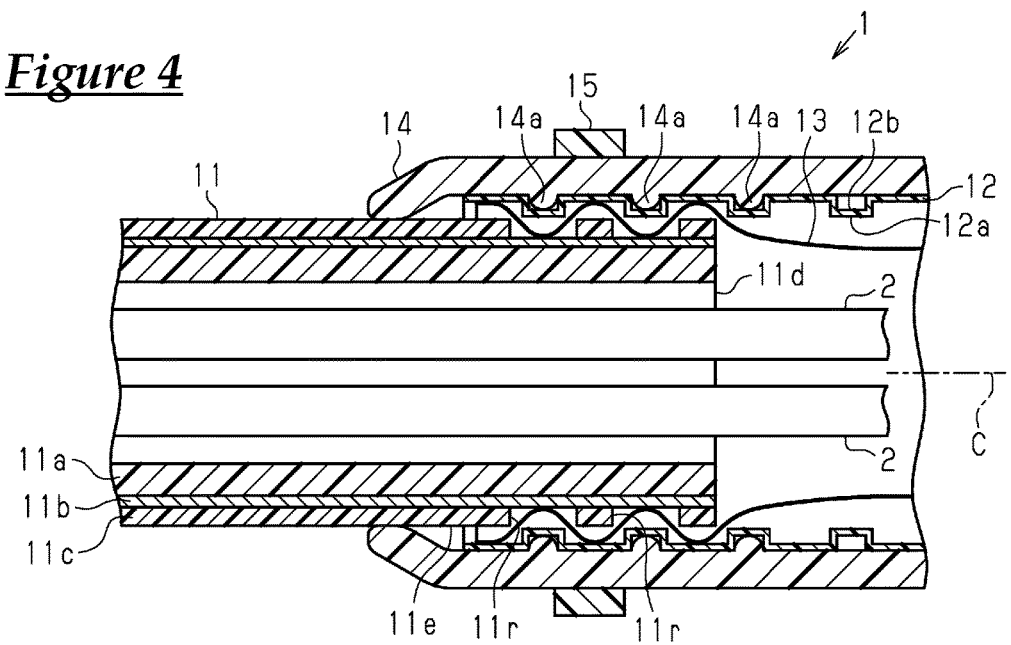
FIG. 4 is a cross-sectional view of a connection portion of the harness according to the first embodiment.

As shown in FIG. 4, the braided member 13 is disposed between the corrugated tube 12 and the wire 2, as described above. The braided member 13 is conductive. The braided member 13 is configured, for example, as a tubular sheet obtained by braiding thin metal wires.

An end portion of the braided member 13 that is located on the electromagnetic shielding tube 11 side is connected to the conductive layer 11b of the electromagnetic shielding tube 11. Specifically, at least a part of the braided member 13 is disposed so as to be in contact with the conductive layer 11b within the recess 11r. Note that an end portion of the braided member 13 that is located on the connector 3 side is connected to the casing of the connector 3.

An end portion of the corrugated tube 12 is connected to the electromagnetic shielding tube 11. Specifically, an end portion of the electromagnetic shielding tube 11 is inserted into the corrugated tube 12, and the annular protrusion 12a of the corrugated tube 12 is fitted to the recess 11r of the electromagnetic shielding tube 11. At a portion where the corrugated tube 12 and the electromagnetic shielding tube 11 are connected, the braided member 13 is disposed between the corrugated tube 12 and the electromagnetic shielding tube 11. The braided member 13 comes into contact with the conductive layer 11b due to being interposed between the corrugated tube 12 and the electromagnetic shielding tube 11. For the sake of convenience, FIG. 4 shows that there is a gap between the corrugated tube 12 and the electromagnetic shielding tube 11 and the gap is shown to be large enough to be visible. However, it is preferable that such a gap is not present.

The connection portion between the corrugated tube 12 and the electromagnetic shielding tube 11 is covered with a waterproofing cover 14.

The waterproofing cover 14 is configured to have a tubular shape and is made of rubber or an elastomer, for example. The waterproofing cover 14 is configured to cover at least an end of the corrugated tube 12. The waterproofing cover 14 inhibits entry of water into the gap between the electromagnetic shielding tube 11 and the corrugated tube 12.

The waterproofing cover 14 includes an insertion portion 14a that is inserted into an annular recess 12b of the corrugated tube 12 that is located on the opposite side of the annular protrusion 12a. As a result of the insertion portion 14a and the annular recess 12b engaging with each other, the waterproofing cover 14 is positioned relative to the corrugated tube 12, so that an end of the corrugated tube 12 is covered by the waterproofing cover 14. The waterproofing cover 14 is fastened to the electromagnetic shielding tube 11 with a band 15. Preferably, in a state in which the insertion portion 14a of the waterproofing cover 14 is inserted into the annular recess 12b of the corrugated tube 12, and the annular protrusion 12a located on the opposite side of the annular recess 12b is fitted to the recess 11r of the electromagnetic shielding tube 11 with the braided member 13 interposed therebetween, these members are collectively fastened by the band 15. By fastening the band 15, the braided member 13 is pressed against the conductive layer 11b, and the end portion of the waterproofing cover 14 comes into intimate contact with the electromagnetic shielding tube 11. Consequently, the shielding effect and waterproofing performance are enhanced.

The operations and effects of the protective tube 10 according to the present embodiment will be described.

The electromagnetic shielding tube 11 includes the recess 11r that is recessed from the outer surface 11e of the outer layer 11c. With this configuration, the recess 11r of the electromagnetic shielding tube 11 can be used as a portion for engaging with another member. Accordingly, the electromagnetic shielding tube 11 can easily engage with another member.

In the protective tube 10, the waterproofing cover 14 is fastened to the electromagnetic shielding tube 11 by the band 15 in the following manner. The insertion portion 14a of the waterproofing cover 14 is inserted into the annular recess 12b of the corrugated tube 12, and the annular protrusion 12a located on the opposite side of the annular recess 12b is fitted to the recess 11r of the electromagnetic shielding tube 11 with the braided member 13 interposed therebetween.

With this configuration, the braided member 13, the corrugated tube 12, and the waterproofing cover 14 are collectively fastened to the electromagnetic shielding tube 11 by the band 15. Accordingly, the electromagnetic shielding tube 11, the braided member 13, the corrugated tube 12, and the waterproofing cover 14 can be easily connected.

Second Embodiment

Figure 5:
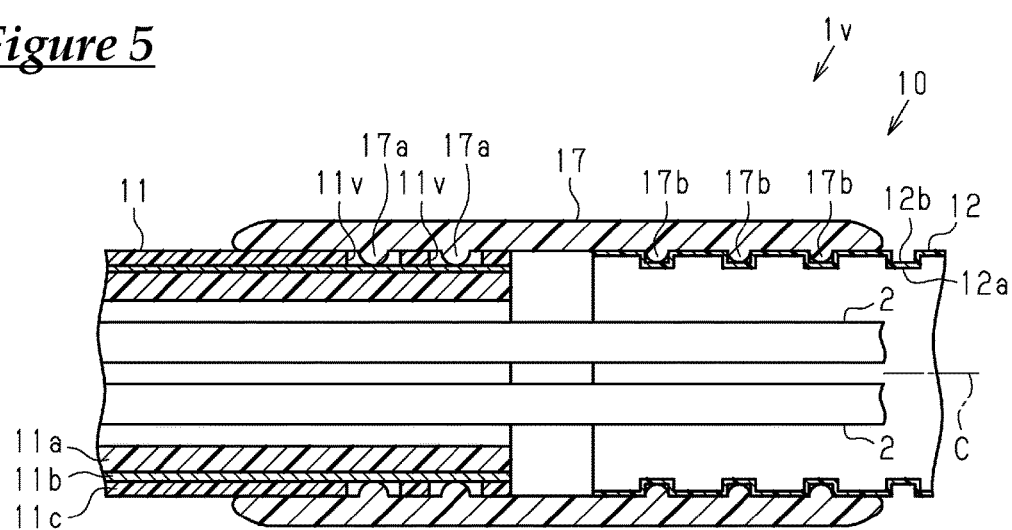
FIG. 5 is a cross-sectional view of a connection portion of a harness according to a second embodiment.

A harness 1v according to a second embodiment will be described with reference to FIG. 5.

The harness 1v includes one or more wires 2 that are coated with a resin, and a protective tube 10 that protects the wire 2. The protective tube 10 includes an electromagnetic shielding tube 11 that covers the wire 2, a corrugated tube 12, and a connection tube 17 that connects the electromagnetic shielding tube 11 and the corrugated tube 12. The connection tube 17 is made of rubber or an elastomer, and is configured to have a tubular shape. The electromagnetic shielding tube 11 is inserted into one end portion of the connection tube 17. The connection tube 17 and the electromagnetic shielding tube 11 are connected in a water-tight manner. The corrugated tube 12 is inserted into the other end portion of the connection tube 17. The connection tube 17 and the corrugated tube 12 are connected in a water-tight manner.

The electromagnetic shielding tube 11 includes at least one recess 11v. The recess 11v is provided at an end portion of the electromagnetic shielding tube 11 to which the connection tube 17 is connected. The recess 11v is configured, for example, as an annular groove that is continuous around an extended axis C of the electromagnetic shielding tube 11.

The connection tube 17 includes a protrusion 17a that engages with the recess 11v of the electromagnetic shielding tube 11. The protrusion 17a protrudes inward from the inner peripheral surface of the connection tube 17. As a result of the protrusion 17a being engaged with the recess 11v, the connection tube 17 and the electromagnetic shielding tube 11 are connected to each other. This inhibits removal of the connection tube 17.

The connection tube 17 includes a protrusion 17b that engages with the annular recess 12b of the corrugated tube 12. The protrusion 17b protrudes inward from the inner peripheral surface of the connection tube 17. As a result of the protrusion 17b being engaged with the annular recess 12b of the corrugated tube 12, the connection tube 17 and the corrugated tube 12 are connected to each other. This suppresses the connection tube 17 from coming loose. As in the first embodiment, the connection tube 17 and the electromagnetic shielding tube 11 may be fastened with a band. Alternatively, the connection tube 17 and the corrugated tube 12 may be fastened with a band.

The operations and effects of the protective tube 10 according to the present embodiment will be described.

In the protective tube 10 described above, the electromagnetic shielding tube 11 includes at least one recess 11v. The recess 11v is provided at the end portion of the electromagnetic shielding tube 11 to which the connection tube 17 is connected. Then, the connection tube 17 includes a protrusion 17a that is to be engaged with the recess 11v, and the protrusion 17a of the connection tube 17 is engaged with the recess 11v. With this configuration, the electromagnetic shielding tube 11 and the connection tube 17 can be easily connected to each other.

Third Embodiment

Figure 6:
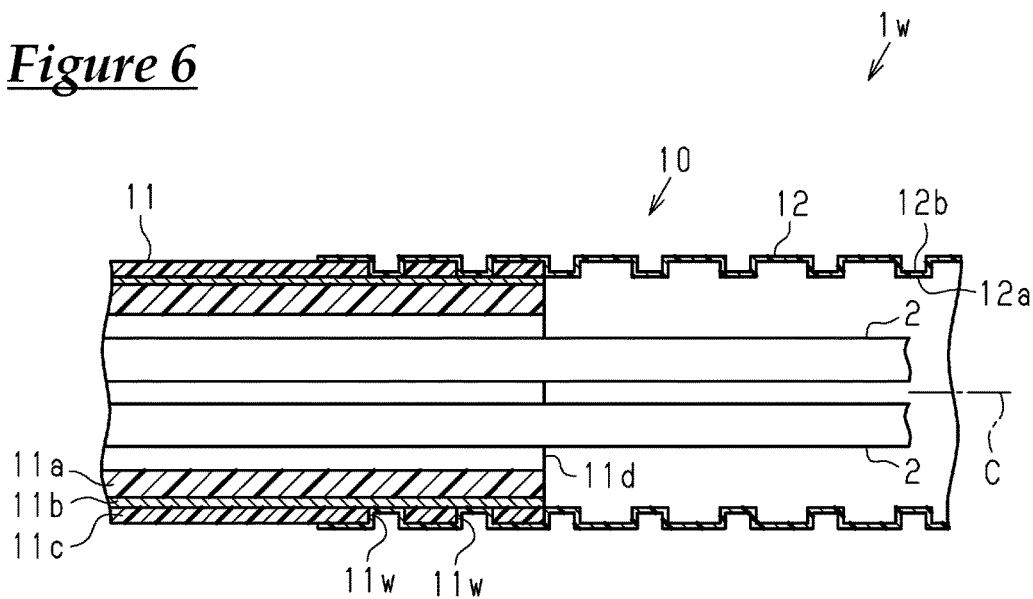
FIG. 6 is a cross-sectional view of a connection portion of a harness according to a third embodiment.

A harness 1w according to a third embodiment will be described with reference to FIG. 6.

The harness 1w includes one or more wires 2 that are coated with a resin, and a protective tube 10 that protects the wire 2. The protective tube 10 includes an electromagnetic shielding tube 11 and a corrugated tube 12 that is connected to the electromagnetic shielding tube 11.

The electromagnetic shielding tube 11 includes at least one recess 11w (two recesses 11w in the present embodiment). The recess 11w is configured as an annular groove that is continuous around an extended axis C of the electromagnetic shielding tube 11 at an end portion to which the corrugated tube 12 is connected. The recess 11w is disposed inward of an end 11d of the electromagnetic shielding tube 11 in a direction extending along an extended axis C. That is, the outer layer 11c remains at the end portion of the electromagnetic shielding tube 11. The annular protrusion 12a of the corrugated tube 12 is fitted to the recess 11w. Thus, with the harness 1v, the electromagnetic shielding tube 11 and the corrugated tube 12 can be easily connected to each other. Note that the electromagnetic shielding tube 11 and the corrugated tube 12 may be fastened with a band.

Fourth Embodiment

Figure 7:
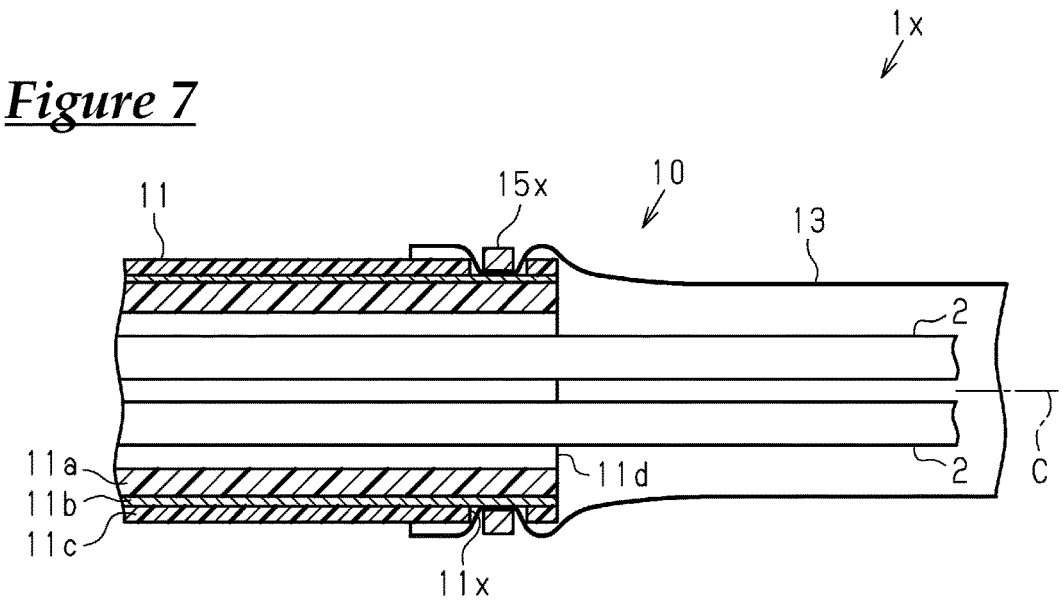
FIG. 7 is a cross-sectional view of a connection portion of a harness according to a fourth embodiment.

A harness 1x according to a fourth embodiment will be described with reference to FIG. 7.

The harness 1x includes one or more wires 2 that are coated with a resin, and a protective tube 10 that protects the wire 2. The protective tube 10 includes an electromagnetic shielding tube 11, and a conductive braided member 13 that is connected to the electromagnetic shielding tube 11. The electromagnetic shielding tube 11 includes at least one recess 11x.

The recess 11x is provided so as to expose the conductive layer 11b of the electromagnetic shielding tube 11, at an end portion of the electromagnetic shielding tube 11 to which a braided member 13 is connected. Further, the recess 11x is configured as an annular groove that is continuous around an extended axis C of the electromagnetic shielding tube 11, and inward of an end 11d of the electromagnetic shielding tube 11 in a direction extending along the extended axis C of the electromagnetic shielding tube 11. At least a part of the braided member 13 is fastened to and depressed into the recess 11x by a band 15x.

With this configuration, the conductive layer 11b exposed in the recess 11x of the electromagnetic shielding tube 11 is connected to the braided member 13. Thus, the electromagnetic shielding tube 11 and the braided member 13 can be easily connected to each other such that the conductive layer 11b of the electromagnetic shielding tube 11 and the braided member 13 are brought into electrical conduction.

Fifth Embodiment

Figure 8:
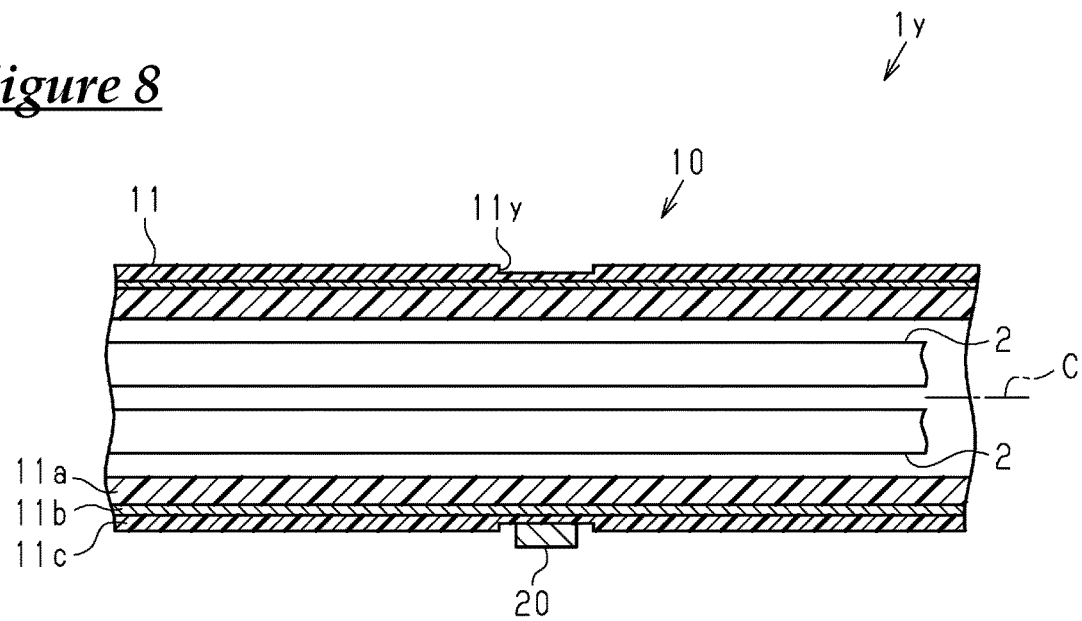
FIG. 8 is a cross-sectional view of a support portion of a harness according to a fifth embodiment.

A harness 1y according to a fifth embodiment will be described with reference to FIG. 8.

The harness 1y includes one or more wires 2 that are coated with a resin, and a protective tube 10 that protects the wire 2. The protective tube 10 includes an electromagnetic shielding tube 11. The electromagnetic shielding tube 11 is provided with a recess 11y. The recess 11y is configured as an annular groove that is continuous around an extended axis C of the electromagnetic shielding tube 11, between opposite end portions of the electromagnetic shielding tube 11. Furthermore, the recess 11y has a depth that does not reach the conductive layer 11b. That is, the conductive layer 11b is not exposed in the recess 11y.

With this configuration, a clamp 20 that holds the electromagnetic shielding tube 11 can be engaged with the recess 11y. Since the conductive layer 11b is not exposed, the conductive layer 11b is unlikely to degrade at that portion.

Here, the clamp 20 is provided, for example, underneath the floor of a vehicle, and holds the electromagnetic shielding tube 11. The clamp 20 is configured to have a shape that follows the outer surface 11e of the electromagnetic shielding tube 11. The clamp 20 is made of an elastic member such as a metal.

In the above-described configuration, the width (the width in the direction of the extended axis C) of the recess 11y is larger than the width (the width in the direction of the extended axis C) of the clamp 20. For example, when connecting the connector 3 to an electric device during installation of the harness 1y, the electromagnetic shielding tube 11 may slide in the direction of the extended axis C. It is preferable that the width of the recess 11y is sufficiently large so as not to limit the sliding.

Other Embodiments

The structure of the protective tube 10 described above is not limited to the above embodiment.

Figure 9:
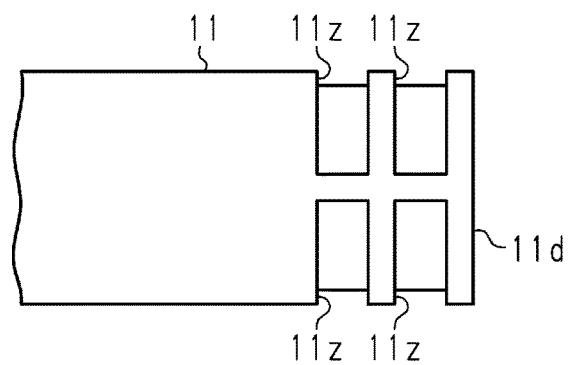
FIG. 9 is a side view of a modification of the electromagnetic shielding tube.

A modification of the electromagnetic shielding tube 11 will be described with reference to FIG. 9.

In the case of a structure in which the electromagnetic shielding tube 11 and the corrugated tube 12 are not directly connected to each other, the shape of the recess of the electromagnetic shielding tube 11 may be changed to a configuration different from an annular shape. For example, in the second embodiment (see FIG. 5), the recess 11v provided in the electromagnetic shielding tube 11 is configured as an annular groove that is continuous around the extended axis C of the electromagnetic shielding tube 11. However, the recess 11v may be configured to have a structure different from an annular groove. In the fourth embodiment (see FIG. 7), the recess 11x provided in the electromagnetic shielding tube 11 is configured as an annular groove that is continuous around the extended axis C of the electromagnetic shielding tube 11. However, the recess 11x may be changed to a groove structure into which at least a part of the band 15x is guided. For example, as shown in FIG. 9, a recess 11z may be configured as a plurality of arc-shaped grooves extending along an annular shape that is continuous around the extended axis C of the electromagnetic shielding tube 11. The effects similar to those of the second embodiment and the fourth embodiment can be achieved with such a configuration as well. With such a structure, the outer layer 11c that remains at the end 11d of the electromagnetic shielding tube 11 is coupled to the outer layer 11c at a portion located away from the end 11d, so that detachment of the outer layer 11c that remains on the end 11d side can be inhibited.

In the embodiments, each of the harnesses 1, 1v, 1w, 1x, and 1y includes the recess 11r, 11v, 11w, 11x, 11y, or 11z in the protective tube 10.

Accordingly, the protective tube 10 can be easily engaged with another member. Examples of another member include the corrugated tube 12, the braided member 13, the connection tube 17, and the clamp 20.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

LIST OF REFERENCE NUMERALS

1 Harness
1v Harness
1w Harness

1x Harness
1y Harness
2 Wire
3 Connector
10 Protective tube
11 Electromagnetic shielding tube
11a Inner layer
11b Conductive layer
11c Outer layer
11d End
11e Outer surface
11r Recess
11v Recess
11w Recess
11x Recess
11y Recess
11z Recess
12 Corrugated tube
12 Annular protrusion
12b Annular recess
13 Braided member
14 Waterproofing cover
14a Insertion portion
15 Band
15x Band
16 Grommet
17 Connection tube
17a Protrusion
17b Protrusion
20 Clamp
C Extended axis

What is claimed is:

1. A protective tube that protects a wire, comprising:
an electromagnetic shielding tube, wherein the electromagnetic shielding tube includes at least a conductive layer and an outer layer that covers the conductive layer, and the electromagnetic shielding tube includes a recess that is recessed from an outer surface of the outer layer;
wherein the protective tube includes the electromagnetic shielding tube, a conductive braided member that is connected to the conductive layer of the electromagnetic shielding tube, a corrugated tube that is connected to the electromagnetic shielding tube so as to cover the braided member, and a waterproofing cover that covers a connection portion between the electromagnetic shielding tube and the corrugated tube,
the electromagnetic shielding tube includes the recess, the recess is configured as an annular groove that is continuous around an extended axis of the electromagnetic shielding tube at an end portion to which the corrugated tube is connected, the recess is disposed inward of an end of the electromagnetic shielding tube in a direction extending along the extended axis, and is configured to expose the conductive layer of the electromagnetic shielding tube,
at least a part of the braided member is disposed so as to be in contact with the conductive layer in the recess,
the waterproofing cover includes an insertion portion that is inserted into an annular recess located on an opposite side of an annular protrusion of the corrugated tube, and
the waterproofing cover is fastened to the electromagnetic shielding tube with a band such that the insertion portion of the waterproofing cover is inserted into the annular recess of the corrugated tube, and that the annular protrusion located on the opposite side of the annular recess is fitted to the recess of the electromagnetic shielding tube with the braided member interposed therebetween.

2. The protective tube according to claim 1, wherein
the protective tube includes a connection tube that is connected to the electromagnetic shielding tube,
the connection tube is connected to the end portion of the electromagnetic shielding tube, and
the connection tube includes a protrusion for engagement with the recess, and the protrusion of the connection tube is engaged with the recess.

3. The protective tube according to claim 1, wherein
the part of the braided member is fastened and depressed into the recess by the band.

4. A harness comprising:
the protective tube according to claim 1; and
a wire that is inserted through the protective tube.

* * * * *